(12) United States Patent
Lee

(10) Patent No.: US 11,204,387 B2
(45) Date of Patent: Dec. 21, 2021

(54) APPARATUS FOR DIAGNOSING RELAY DRIVING CIRCUIT

(71) Applicant: LG Chem, Ltd., Seoul (KR)

(72) Inventor: Sun-Jong Lee, Daejeon (KR)

(73) Assignee: LG Chem, Ltd.

( * ) Notice: Subject to any disclaimer, the term of this patent is extended or adjusted under 35 U.S.C. 154(b) by 194 days.

(21) Appl. No.: 16/621,377

(22) PCT Filed: Jan. 30, 2019

(86) PCT No.: PCT/KR2019/001312
§ 371 (c)(1),
(2) Date: Dec. 11, 2019

(87) PCT Pub. No.: WO2019/151781
PCT Pub. Date: Aug. 8, 2019

(65) Prior Publication Data
US 2020/0166574 A1 May 28, 2020

(30) Foreign Application Priority Data
Jan. 30, 2018 (KR) .......................... 10-2018-0011459

(51) Int. Cl.
G01R 31/327 (2006.01)
G01R 19/165 (2006.01)
G01R 31/52 (2020.01)

(52) U.S. Cl.
CPC ... *G01R 31/3278* (2013.01); *G01R 19/16519* (2013.01); *G01R 31/52* (2020.01)

(58) Field of Classification Search
CPC .. G01R 31/52; G01R 31/3278; G01R 19/165; G01R 31/327; G01R 19/16576;
(Continued)

(56) References Cited

U.S. PATENT DOCUMENTS 4,631,474 A 12/1986 Dolland
2003/0231029 A1 12/2003 Tamura
(Continued)

FOREIGN PATENT DOCUMENTS

DE 102015208377 A1 4/2016
JP H09223444 A 8/1997
(Continued)

OTHER PUBLICATIONS

International Search Report for Application No. PCT/KR2019/001312, dated May 10, 2019, pp. 1-2.
(Continued)

*Primary Examiner* — Jermele M Hollington
*Assistant Examiner* — Suresh K Rajaputra
(74) *Attorney, Agent, or Firm* — Lerner, David, Littenberg, Krumholz & Mentlik, LLP

(57) ABSTRACT

An apparatus for diagnosing a relay driving circuit includes a sensing unit configured to measure a first measured voltage, a second measured voltage and a third measured voltage respectively applied to one end of the first switch, one end of the second switch and one end of the third switch; and a processor operably coupled to the sensing unit. The processor controls operation states of the first switch, the second switch and the third switch and diagnoses whether the relay driving circuit has a fault based on at least one of the first measured voltage, the second measured voltage and the third measured voltage measured by the sensing unit in a state where a diagnosing circuit is formed by controlling the operation states.

15 Claims, 6 Drawing Sheets

(58) Field of Classification Search
CPC .. G01R 31/06; G01R 31/3277; H01H 47/002;
H02H 3/044
See application file for complete search history.

(56) References Cited

U.S. PATENT DOCUMENTS

| | | | |
|---|---|---|---|
| 2008/0079318 A1* | 4/2008 | Burr | H01H 47/005 |
| | | | 307/115 |
| 2011/0193562 A1 | 8/2011 | Matsuno et al. | |
| 2013/0222008 A1 | 8/2013 | Lavenier et al. | |
| 2014/0055059 A1* | 2/2014 | Uryu | B62D 5/0484 |
| | | | 318/9 |
| 2016/0343526 A1 | 11/2016 | Schicke, II | |

FOREIGN PATENT DOCUMENTS

| | | |
|---|---|---|
| JP | 3183254 B2 | 7/2001 |
| JP | 2004234207 A | 8/2004 |
| JP | 2013072689 A | 4/2013 |
| JP | 2013542406 A | 11/2013 |
| KR | 20030095325 A | 12/2003 |
| KR | 100529152 B1 | 11/2005 |
| KR | 20160055647 A | 5/2016 |
| KR | 20160079507 A | 7/2016 |
| KR | 20170024818 A | 3/2017 |
| WO | 2010145692 A1 | 12/2010 |

OTHER PUBLICATIONS

Extended European Search Report including Written Opinion for EP19748014.8 dated Nov. 10, 2020; 6 pages.

* cited by examiner

APPARATUS FOR DIAGNOSING RELAY DRIVING CIRCUIT

CROSS-REFERENCE TO RELATED APPLICATIONS

The present application is a national phase entry under 35 U.S.C. § 371 of International Application No. PCT/KR2019/001312 filed Jan. 30, 2019, which claims priority to Korean Patent Application No. 10-2018-0011459 filed on Jan. 30, 2018 in the Republic of Korea, the disclosures of which are incorporated herein by reference.

TECHNICAL FIELD

The present disclosure relates to a technique for diagnosing whether a relay driving circuit for driving a relay has a fault, and more particularly, to an apparatus for diagnosing whether a relay driving circuit for driving a relay has a fault by energizing a relay coil.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance secondary batteries allowing repeated charging and discharging are being actively studied.

Secondary batteries commercially available at the present include nickel-cadmium batteries, nickel hydrogen batteries, nickel-zinc batteries, lithium secondary batteries and the like. Among them, the lithium secondary batteries are in the limelight since they have almost no memory effect compared to nickel-based secondary batteries and also have very low self-discharging rate and high energy density.

Meanwhile, the secondary battery may be used as a single secondary battery, but in many cases, the secondary battery is used in the form of a battery pack in which a plurality of secondary cells are connected in series and/or in parallel, in order to serve a high-voltage and/or large-capacity power storage system.

The battery pack is mounted in an electric vehicle (EV), a hybrid electric vehicle (HEV), an electric storage system (ESS) or the like and is used to supply an electric power to a load such as an electric motor and an inverter.

Generally, a relay is provided on a power supply line between the battery pack and the load, and the relay functions to selectively form a closed circuit. Also, the relay may have a relay driving circuit, including a relay coil, for switching operation. Here, the relay driving circuit is connected to the relay coil to energize the relay coil. That is, the relay driving circuit energizes the relay coil to turn on the relay and de-energizes the relay coil to turn off the relay. Generally, the relay driving circuit energizes or de-energizes the relay coil by a switch control operation that turns on or off a switch connected to the relay coil. However, if the switch connected to the relay coil does not work properly, for example if the switch has a short-circuit fault or an open-circuit fault, the relay may not work properly. Thus, it is very important to check or diagnose whether or not the relay has a fault, especially whether or not the relay driving circuit has a fault.

Meanwhile, the fault of the relay driving circuit should be diagnosed before driving the relay. That is, it is needed to diagnose whether the relay driving circuit has a fault before the relay is turned on. After the relay is turned on, it is difficult to diagnose whether the relay driving circuit has a fault, and even though it is diagnosed that the relay driving circuit has a fault, it may be impossible to turn off the relay. This may cause a safety accident.

On the other hand, while it is diagnosed whether the relay driving circuit has a fault, the relay driving circuit may be controlled. In this case, a safety accident may occur while the relay driving circuit is being controlled.

DISCLOSURE

Technical Problem

The present disclosure is designed to solve the problems of the related art, and therefore the present disclosure is directed to providing an apparatus for diagnosing a relay driving circuit, which may diagnose whether or not the relay driving circuit has a fault.

The present disclosure is also directed to providing an apparatus for diagnosing a relay driving circuit, which may diagnose whether the relay driving circuit has a fault and also prevent a safety accident while diagnosing whether the relay driving circuit has a fault.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for diagnosing a fault of a relay driving circuit that includes a first relay coil and a second relay coil, wherein a first end of the first relay coil is connected to a first end of the second relay coil, a first switch having a first end connected to the first end of the first relay coil and the first end of the second relay coil, a first power source configured to apply an auxiliary voltage to a second end of the first switch, a first pull-up resistor having a first end connected to a second end of the first relay coil, a second power source configured to apply a pull-up voltage to a second end of the first pull-up resistor, a second switch having a first end connected to a second end of the first relay coil and the first end of the first pull-up resistor, a second pull-up resistor having a first end connected to a second end of the second relay coil, a third power source configured to apply the pull-up voltage to the second end of the second pull-up resistor, and a third switch having a first end connected to the second end of the second relay coil and the first end of the second pull-up resistor.

The apparatus may be configured to measure a first measured voltage, a second measured voltage and a third measured voltage respectively applied to the first end of the first switch, the first end of the second switch and the first end of the third switch. The apparatus may include a processor.

Preferably, the processor may be configured to control operation states of the first switch, the second switch and the third switch and in an operation state that forms a diagnosing circuit, diagnose whether the relay driving circuit has a fault based on at least one of the first measured voltage, the second measured voltage and the third measured voltage measured by the apparatus.

Preferably, the processor may be configured to control the operation states of the first switch, the second switch and the third switch into a turn-off state, respectively, to form a first diagnosing circuit; and when the first diagnosing circuit is formed, diagnose whether the relay driving circuit has a short-circuit fault based on at least one of the first measured voltage, the second measured voltage and the third measured voltage.

Preferably, the processor may be configured to diagnose whether the first switch has a short-circuit fault by comparing the first measured voltage with at least one of the pull-up voltage and the auxiliary voltage, diagnose whether the second switch has a short-circuit fault by comparing the second measured voltage with a ground voltage, and diagnose whether the third switch has a short-circuit fault by comparing the third measured voltage with the ground voltage.

Preferably, the processor may be configured to determine that the first switch has a short-circuit fault when the first measured voltage is not identical to the pull-up voltage and the first measured voltage is identical to the auxiliary voltage, determine that the second switch has a short-circuit fault when the second measured voltage is identical to the ground voltage, and determine that the third switch has a short-circuit fault when the third measured voltage is identical to the ground voltage.

Preferably, the processor may be configured to control the operation states of the first switch and the third switch into a turn-off state, respectively, and the operation state of the second switch into a turn-on state to form a second diagnosing circuit, and when the second diagnosing circuit is formed, diagnose whether the relay driving circuit has an open-circuit fault based on at least one of the first measured voltage, the second measured voltage and the third measured voltage.

Preferably, the processor may be configured to diagnose whether the second switch has an open-circuit fault by comparing the second measured voltage with a ground voltage.

Preferably, the processor may be configured to determine that the second switch has an open-circuit fault when the second measured voltage is not identical to the ground voltage.

Preferably, the processor may be configured to control the operation states of the first switch and the second switch into a turn-off state, respectively, and the operation state of the third switch into a turn-on state, to form a third diagnosing circuit, and when the third diagnosing circuit is formed, diagnose whether the relay driving circuit has an open-circuit fault based on at least one of the first measured voltage, the second measured voltage and the third measured voltage.

Preferably, the processor may be configured to diagnose whether the third switch has an open-circuit fault by comparing the third measured voltage with a ground voltage.

Preferably, the processor may be configured to determine that the third switch has an open-circuit fault when the third measured voltage is not identical to a ground voltage.

Preferably, the processor may be configured to control the operation states of the second switch and the third switch into a turn-off state, respectively, and the operation state of the first switch into a turn-on state to form a fourth diagnosing circuit, and when the fourth diagnosing circuit is formed, diagnose whether the relay driving circuit has an open-circuit fault based on at least one of the first measured voltage, the second measured voltage and the third measured voltage.

Preferably, the processor may be configured to diagnose whether the first switch has an open-circuit fault by comparing the first measured voltage with the auxiliary voltage.

Preferably, the processor may be configured to determine that the first switch has an open-circuit fault when the first measured voltage is not identical to the auxiliary voltage.

A battery management device according to the present disclosure may include an apparatus for diagnosing a relay driving circuit as described in any of the embodiments herein.

A battery pack according to the present disclosure may include an apparatus for diagnosing a relay driving circuit as described in any of the embodiments herein.

Advantageous Effects

According to the present disclosure, it is possible to diagnose whether the relay driving circuit has a fault through a simple switching operation. Further, according to an embodiment of the present disclosure, it is possible to diagnose a fault of the relay driving circuit without turning on the relay, so there is no risk of a safety accident during the fault diagnosing process for the relay driving circuit.

According to another embodiment of the present disclosure, it is possible to diagnose all of a short-circuit fault and an open-circuit fault of the switch and a disconnection fault of the relay coil or the like through a series of diagnostic processes.

In addition, the present disclosure may have various other effects, and these other effects of the present disclosure can be understood by the following description and more clearly understood by the embodiments of the present disclosure.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 4 is a diagram showing that the first switch and the third switch of the relay driving circuit of FIG. 2 are turned off and the second switch is turned on.

FIG. 6 is a diagram showing that the first switch and the second switch of the relay driving circuit of FIG. 2 are turned off and the third switch is turned on.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

Figure 1:
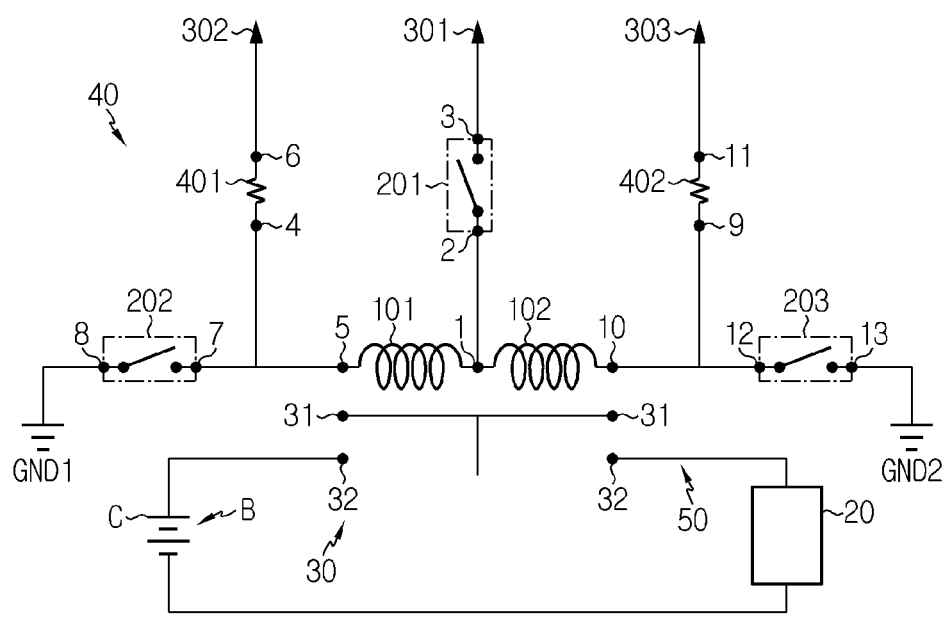
FIG. 1 is a diagram schematically showing a battery system according to an embodiment of the present disclosure.

FIG. 1 is a diagram schematically showing a battery system according to an embodiment of the present disclosure.

Referring to FIG. 1, the battery system according to an embodiment of the present disclosure includes a battery assembly B, a load 20, a relay 30 and a power supply line 50.

The battery assembly B includes at least one battery cell C. That is, the battery assembly B means a unit battery cell C or a group of battery cells C. If the battery assembly B is implemented as a group of two or more battery cells C, two or more battery cells C may be connected in series, in parallel, or in a combination thereof.

The load 20 may receive power from the battery assembly B. For example, the load 20 may be an electric motor or an inverter provided in an electric vehicle, a hybrid electric vehicle, or the like. However, the electric motor or inverter is just an example of the load 20, and other electric devices may be employed as the load 20. Moreover, in the battery system, the load 20 may be replaced by a charging device that supplies power to the battery assembly B.

The power supply line 50 forms a path through which a current may flow between the battery assembly B and the load 20. The power supply line 50 may be implemented using an electric line commonly used in the art.

The relay 30 may be provided on the power supply line 50 to form or cut off an electrical connection between the battery assembly B and the load 20. That is, the relay 30 is a kind of switch, which may be selectively turned on or off. In addition, the relay 30 may include a relay driving circuit 40 that has a first relay coil 101 and a second relay coil 102. The relay 30 may be selectively turned on or off by the operation of the relay driving circuit 40.

More specifically, the relay 30 may be turned off when the relay driving circuit 40 is operated to energize the first relay coil 101 and be turned on when the relay driving circuit 40 is operated to energize the second relay coil 102. According to an embodiment, the relay 30 may be a two-way relay.

Figure 2:
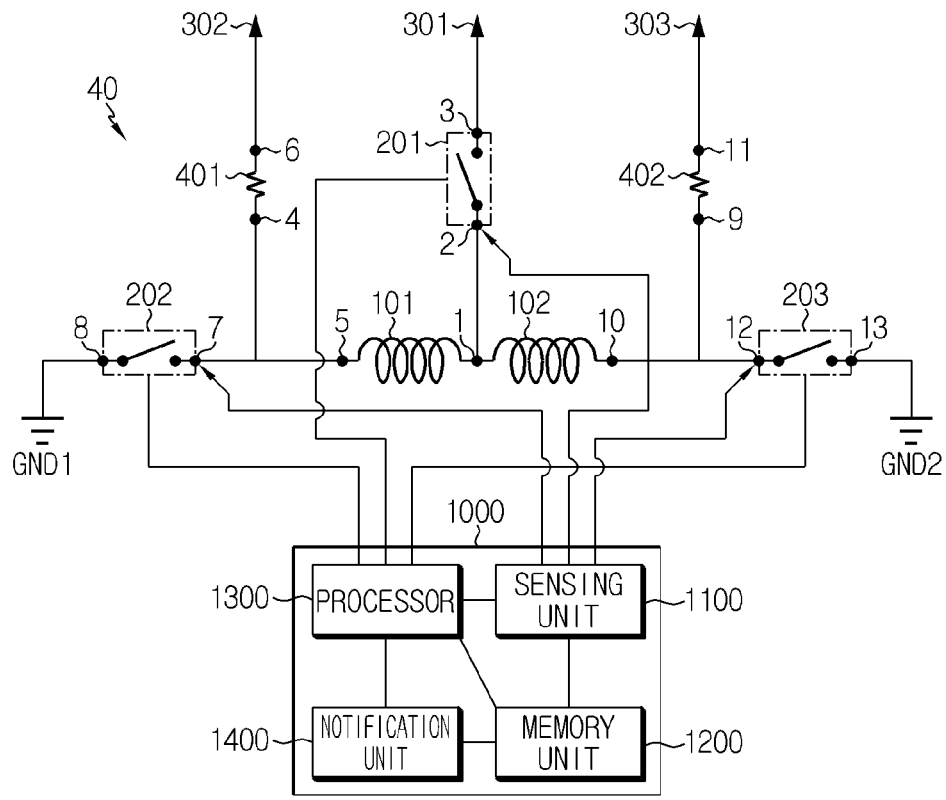
FIG. 2 is a diagram schematically showing a connection configuration between a relay driving circuit according to an embodiment of the present disclosure and an apparatus for diagnosing a relay driving circuit according to an embodiment of the present disclosure.

FIG. 2 is a diagram schematically showing a connection configuration between the relay driving circuit 40 according to an embodiment of the present disclosure and an apparatus 1000 for diagnosing a relay driving circuit according to an embodiment of the present disclosure.

Referring to FIGS. 1 and 2, the relay driving circuit 40 according to an embodiment of the present disclosure includes a first relay coil 101, a second relay coil 102, a first switch 201, a second switch 202, a third switch 203, a first power source 301, a second power source 302, a third power source 303, a first pull-up resistor 401 and a second pull-up resistor 402.

The first relay coil 101 may be energized by receiving an auxiliary voltage from the first power source 301, explained later. Namely, the first relay coil 101 may generate a magnetic field by receiving the auxiliary voltage from the first power source 301. Selectively, the first relay coil 101 may have a magnetic core therein to concentrate magnetic force lines.

According to an embodiment, if the operation states of the first switch 201 and the second switch 202 are controlled into a turn-on state, the first relay coil 101 may be energized by receiving the auxiliary voltage from the first power source 301 to guide a movable contact point 31 of the relay 30 not to come into contact with a fixed contact point 32. On the contrary, if the operation states of the first switch 201 and the second switch 202 are controlled into a turn-off state, the first relay coil 101 may not be energized because the auxiliary voltage is not applied thereto from the first power source 301.

The second relay coil 102 may be energized by receiving the auxiliary voltage from the first power source 301, explained later. That is, the second relay coil 102 may generate a magnetic field by receiving the auxiliary voltage from the first power source 301. Selectively, the second relay coil 102 may have a magnetic core therein to concentrate magnetic force lines.

According to an embodiment, if the operation states of the first switch 201 and the third switch 203 are controlled into a turn-on state, the second relay coil 102 may be energized by receiving the auxiliary voltage from the first power source 301 to guide the movable contact point 31 provided in the relay 30 to be connected to the fixed contact point 32. On the contrary, if the operation states of the first switch 201 and the third switch 203 are controlled into a turn-off state, the second relay coil 102 may not be energized because the auxiliary voltage is not applied thereto from the first power source 301.

That is, if the first relay coil 101 is energized, the relay 30 may be turned off, and if the second relay coil 102 is energized, the relay 30 may be turned on.

Meanwhile, as shown in FIGS. 1 and 2, one end 1 of the first relay coil 101 and one end 1 of the second relay coil 102 may be connected to each other.

The first switch 201 may be selectively turned-on or turned-off. The switches may be implemented with a variety of known switching elements. For example, the switches may be implemented using a bipolar junction transistor (BJT), a field effect transistor (FET) and the like.

The first switch 201 may be provided between the first and second relay coils 101, 102 and the first power source 301. More specifically, the first switch 201 may have one end 2 connected to one end 1 of the first relay coil 101 and one end 1 of the second relay coil 102 and also have the other end 3 connected to the first power source 301.

The first power source 301 applies the auxiliary voltage to the first relay coil 101 or the second relay coil 102. That is, the first power source 301 is connected to the other end 3 of the first switch 201 to apply the auxiliary voltage to the first relay coil 101 and the second relay coil 102 when the first switch 201 is turned on.

The first pull-up resistor 401 may be provided between the first relay coil 101 and the second power source 302. More specifically, the first pull-up resistor 401 may have one end 4 connected to the other end 5 of the first relay coil 101 and have the other end 6 connected to the second power source 302. Meanwhile, one end 4 of the first pull-up resistor 401 may be connected to one end 7 of the second switch 202. The first pull-up resistor 401 may have a resistance greater than the resistance of the first relay coil 101. More specifically, the resistance of the first pull-up resistor 401 may be greater than the resistance of the first relay coil 101 enough to replace the resistance of the first relay coil 101 with "0 ohm".

The second power source 302 applies a pull-up voltage to the first pull-up resistor 401. That is, the second power source 302 is connected to the other end 6 of the first pull-up resistor 401 to apply the pull-up voltage to the first pull-up resistor 401.

The second switch 202 may be selectively turned on or turned off. The switches may be implemented with a variety of known switching elements. For example, the switches may be implemented as using a bipolar junction transistor (BJT), a field effect transistor (FET), and so on.

The second switch 202 may be provided between the first relay coil 101 and a first ground GND1. More specifically, the second switch 202 may have one end 7 connected to the other end 5 of the first relay coil 101 and have the other end 8 connected to the first ground GND1. Also, one end 7 of the second switch 202 may be connected to one end 4 of the first pull-up resistor 401.

Accordingly, if the second switch 202 is turned on, one end 7 of the second switch 202 may be connected to the first ground GND1, and a ground voltage may be applied to one end 7 of the second switch 202. Here, the ground voltage may be "0V".

The second pull-up resistor 402 may be provided between the second relay coil 102 and the third power source 303. More specifically, the second pull-up resistor 402 may have one end 9 connected to the other end 10 of the second relay coil 102 and have the other end 11 connected to the third power source 303. Meanwhile, one end 9 of the second pull-up resistor 402 may be connected to one end 12 of the third switch 203. The second pull-up resistor 402 may have a resistance greater than the resistance of the second relay coil 102. More specifically, the resistance of the second pull-up resistor 402 may be greater than the resistance of the second relay coil 102 enough to replace the resistance of the second relay coil 102 with "0 ohm".

The third power source 303 applies a pull-up voltage to the second pull-up resistor 402. That is, the third power source 303 is connected to the other end 11 of the second pull-up resistor 402 to apply the pull-up voltage to the second pull-up resistor 402. At this time, the voltage value of the pull-up voltage applied to the second pull-up resistor 402 from the third power source 303 may be identical to the voltage value of the pull-up voltage applied to the first pull-up resistor 401 from the second power source 302.

The third switch 203 may be selectively turned on or turned off. The switches may be implemented with a variety of known switching elements. For example, the switches may be implemented as using a bipolar junction transistor (BJT), a field effect transistor (FET), and so on.

The third switch 203 may be provided between the second relay coil 102 and a second ground GND2. More specifically, the third switch 203 may have one end 12 connected to the other end 10 of the second relay coil 102 and have the other end 13 connected to the second ground GND2. Also, one end 12 of the third switch 203 may be connected to one end 9 of the second pull-up resistor 402.

Accordingly, if the third switch 203 is turned on, one end 12 of the third switch 203 may be connected to the second ground GND2, and a ground voltage may be applied to one end 12 of the third switch 203. Here, the ground voltage may be "0V".

Referring to FIG. 2 again, the apparatus 1000 for diagnosing a relay driving circuit according to an embodiment of the present disclosure includes a sensing unit 1100, a memory unit 1200, a processor 1300, and a notification unit 1400.

The sensing unit 1100 is operably coupled to the processor 1300. That is, the sensing unit 1100 may be connected to the processor 1300 to transmit an electrical signal to the processor 1300 or to receive an electrical signal from the processor 1300.

The sensing unit 1100 may measure measurement data used for the processor 1300 to diagnose whether the relay driving circuit 40 has a fault.

To that end, the sensing unit 1100 may repeatedly measure a first measured voltage, a second measured voltage and a third measured voltage respectively applied to one end 2 of the first switch 201, one end 7 of the second switch 202 and one end 12 of the third switch 203 at every preset cycle and provide measurement signals representing the first measured voltage, the second measured voltage and the third measured voltage to the processor 1300.

The sensing unit 1100 may include a voltage sensor configured to measure the first measured voltage, the second measured voltage and the third measured voltage respectively applied to one end 2 of the first switch 201, one end 7 of the second switch 202 and one end 12 of the third switch 203.

If a measurement signal is received from the sensing unit 1100, the processor 1300 may determine digital values of the first measured voltage, the second measured voltage and the third measured voltage, respectively, through signal processing and then store the digital values in the memory unit 1200.

The memory unit 1200 is a semiconductor memory device that records, erases and updates data generated by the processor 1300, and stores a plurality of program codes prepared for diagnosing whether the relay driving circuit 40 has a fault. In addition, the memory unit 1200 may store preset values of various predetermined parameters used in implementing the present disclosure.

The memory unit 1200 may is not particularly limited as long as it is a semiconductor memory element known in the art as being capable of recording, erasing and updating data. For example, the memory unit 1200 may be dynamic random access memory (DRAM), synchronous DRAM (SDRAM), a flash memory, read-only memory (ROM), electrically erasable programmable read-only memory (EEPROM), a register, and the like. In addition, the memory unit 1200 may further include a storage medium that stores program codes defining the control logics of the processor

1300. The storage medium includes a non-volatile storage element such as a flash memory or a hard disk. The memory unit 1200 may be physically separate from the processor 1300 or may be integrated with the processor 1300.

The processor 1300 may control the operation states of the first switch 201, the second switch 202 and the third switch 203, namely to open or close the switches. More specifically, the processor 1300 may selectively control the operation states of the first switch 201, the second switch 202 and the third switch 203 into a turn-on state or a turn-off state. According to an embodiment, the processor 1300 may control the switches by transmitting control signals or command signals to the switches.

In addition, the processor 1300 may control the operation states of the first switch 201, the second switch 202 and the third switch 203 in order to diagnose whether the relay driving circuit 40 has a fault. Here, if the operation states of the first switch 201, the second switch 202 and the third switch 203 are controlled into a turn-on state or a turn-off state, respectively, by the processor 1300, various diagnosing circuits may be formed.

More specifically, the processor 1300 may turn off all of the first switch 201, the second switch 202 and the third switch 203. In addition, the relay driving circuit 40 formed by this control of the processor 1300 may be regarded as a first diagnosing circuit.

Also, the processor 1300 may turn off both the first switch 201 and the third switch 203 and turn on the second switch 202. In addition, the relay driving circuit 40 formed by this control of the processor 1300 may be regarded as a second diagnosing circuit.

Also, the processor 1300 may turn off both the first switch 201 and the second switch 202 and turn on the third switch 203. In addition, the relay driving circuit 40 formed by this control of the processor 1300 may be regarded as a third diagnosing circuit.

Also, the processor 1300 may turn off both the second switch 202 and the third switch 203 and turn on the first switch 201. In addition, the relay driving circuit 40 formed by this control of the processor 1300 may be regarded as a fourth diagnosing circuit.

The processor 1300 may diagnose whether the relay driving circuit 40 has a fault based on at least one of the first measured voltage, the second measured voltage and the third measured voltage measured in the state where the diagnosing circuit described above is formed. That is, the processor 1300 controls the operation states of the first switch 201, the second switch 202 and the third switch 203 to form a predetermined diagnosing circuit. If a predetermined diagnosing circuit is formed, the sensing unit 1100 measures the first measured voltage, the second measured voltage and the third measured voltage. The processor 1300 may diagnose whether the relay driving circuit 40 has a fault based on at least one of the first measured voltage, the second measured voltage and the third measured voltage, measured through the above process.

According to an embodiment, the processor 1300 may diagnose whether the relay driving circuit 40 has a short-circuit fault based on at least one of the first measured voltage, the second measured voltage and the third measured voltage in a state where the relay driving circuit 40 is formed as the first diagnosing circuit. Here, the short-circuit fault of the relay driving circuit 40 may be regard as a short-circuit fault of at least one of the first switch 201, the second switch 202 and the third switch 203. In addition, here, the short-circuit fault may refer to a state in which the switch is short-circuited due to fusion or the like and does not respond to a turn-off command or a turn-off control of the processor 1300.

Hereinafter, the operation of diagnosing whether the relay driving circuit 40 has a short-circuit fault will be described with reference to FIG. 3.

Figure 3:
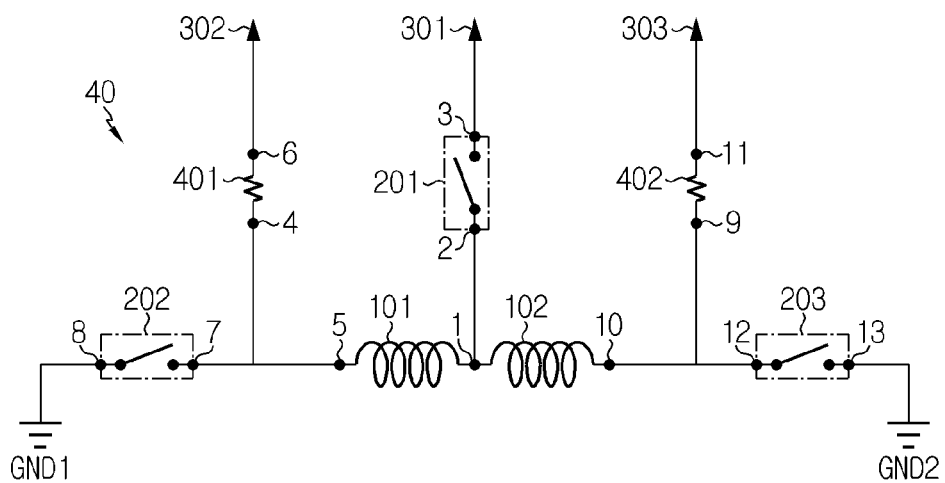
FIG. 3 is a diagram showing that all of the first switch, the second switch and the third switch of the relay driving circuit of FIG. 2 are turned off.

FIG. 3 is a diagram showing that all of the first switch 201, the second switch 202 and the third switch 203 of the relay driving circuit 40 of FIG. 2 are turned off. Namely, FIG. 3 may be regarded as a diagram showing that the first diagnosing circuit is formed.

Referring to FIG. 3, in order to diagnose whether the relay driving circuit 40 has a short-circuit fault, the processor 1300 may control the operation states of all of the first switch 201, the second switch 202 and the third switch 203 into a turn-off state to form the relay driving circuit 40 as the first diagnosing circuit.

Meanwhile, in a state where the first diagnosing circuit is formed, the sensing unit 1100 may measure the first measured voltage, the second measured voltage and the third measured voltage.

In addition, the processor 1300 may diagnose whether the relay driving circuit 40 has a short-circuit fault based on at least one of the first measured voltage, the second measured voltage and the third measured voltage measured in the state where the first diagnosing circuit is formed.

For example, the processor 1300 may diagnose whether the first switch 201 has a short-circuit fault by comparing the first measured voltage measured in the state where the first diagnosing circuit is formed with at least one of the pull-up voltage and the auxiliary voltage. More specifically, if the first measured voltage is not identical to the pull-up voltage and the first measured voltage is identical to the auxiliary voltage, the processor 1300 may diagnose that the first switch 201 has a short-circuit fault.

If the first switch 201 is in a normal state, the first measured voltage should be identical to the pull-up voltage since the first switch 201, the second switch 202 and the third switch 203 are controlled into a turn-off state in the first diagnosing circuit.

That is, if the first switch 201 is in the normal state, the first measured voltage measured from the first diagnosing circuit may be identical to the pull-up voltage.

Conversely, if the first switch 201 has a short-circuit fault, since the first switch 201 is in a turn-on state in the first diagnosing circuit, the first measured voltage should be identical to the auxiliary voltage.

That is, if the first switch 201 has a short-circuit fault, the first measured voltage measured from the first diagnosing circuit may be identical to the auxiliary voltage.

By using this, the processor 1300 may diagnose that the first switch 201 has a short-circuit fault if the first measured voltage measured in the state where the first diagnosing circuit is formed is not identical to the pull-up voltage but identical to the auxiliary voltage.

Conversely, if the first measured voltage measured in the state where the first diagnosing circuit is formed is identical to the pull-up voltage and is not identical to the auxiliary voltage, the processor 1300 may diagnose that the first switch 201 does not have a short-circuit fault.

After that, if the first switch 201 is diagnosed as not being a short-circuit fault, the processor 1300 may compare the second measured voltage measured in the state where the first diagnosing circuit is formed with the ground voltage to diagnose whether the second switch 202 has a short-circuit fault. More specifically, the processor 1300 may diagnose that the second switch 202 has a short-circuit fault if the second measured voltage is identical to the ground voltage.

If the first switch 201, the second switch 202 and the third switch 203 are in a normal state, the first switch 201, the second switch 202 and the third switch 203 are controlled into a turn-off state in the first diagnosing circuit, so the second measured voltage should be identical to the pull-up voltage.

That is, if the second switch 202 is in a normal state, the second measured voltage measured from the first diagnosing circuit may be identical to the pull-up voltage.

Conversely, if the second switch 202 has a short-circuit fault, the second switch 202 is in a turn-on state in the first diagnosing circuit, so the second measured voltage should be identical to the ground voltage.

That is, if the second switch 202 has a short-circuit fault, the second measured voltage measured from the first diagnosing circuit may be identical to the ground voltage.

By using this, the processor 1300 may diagnose that the second switch 202 has a short-circuit fault if the second measured voltage measured in the state where the first diagnosing circuit is formed is identical to the ground voltage.

Conversely, if the second measured voltage measured in the state where the first diagnosing circuit is formed is not identical to the ground voltage, the processor 1300 may diagnose that the second switch 202 does not have a short-circuit fault.

After that, if the first switch 201 and the second switch 202 are diagnosed as not having a short-circuit fault, the processor 1300 may compare the third measured voltage measured in the state where the first diagnosing circuit is formed with the ground voltage to diagnose whether the third switch 203 has a short-circuit fault. More specifically, the processor 1300 may diagnose that the third switch 203 has a short-circuit fault if the third measured voltage is identical to the ground voltage.

If the first switch 201, the second switch 202 and the third switch 203 are in a normal state, the first switch 201, the second switch 202 and the third switch 203 are controlled into a turn-off state in the first diagnosing circuit, so the third measured voltage should be identical to the pull-up voltage.

That is, if the third switch 203 is in a normal state, the third measured voltage measured from the first diagnosing circuit may be identical to the pull-up voltage.

Conversely, if the third switch 203 has a short-circuit fault, the third switch 203 is in a turn-on state in the first diagnosing circuit, so the third measured voltage should be identical to the ground voltage.

That is, if the third switch 203 has a short-circuit fault, the third measured voltage measured from the first diagnosing circuit may be identical to the ground voltage.

By using this, the processor 1300 may diagnose that the third switch 203 has a short-circuit fault if the third measured voltage measured in the state where the first diagnosing circuit is formed is identical to the ground voltage.

Conversely, the processor 1300 may diagnose that the third switch 203 does not have a short-circuit fault if the third measured voltage measured in the state where the first diagnosing circuit is formed is not identical to the ground voltage.

Meanwhile, according to an embodiment, the processor 1300 may diagnose whether the relay driving circuit 40 has an open-circuit fault based on at least one of the first measured voltage, the second measured voltage and the third measured voltage in a state where the relay driving circuit 40 is formed as the second diagnosing circuit. Here, the open-circuit fault of the relay driving circuit 40 may refer to an open-circuit fault of at least one of the first switch 201, the second switch 202 and the third switch 203. In addition, here, the open-circuit fault may refer to a state in which the switch is in an open state and does not respond to a turn-on command or a turn-on control of the processor 1300.

Hereinafter, the operation of diagnosing whether the relay driving circuit 40 has an open-circuit fault will be described with reference to FIG. 4.

Figure 4:
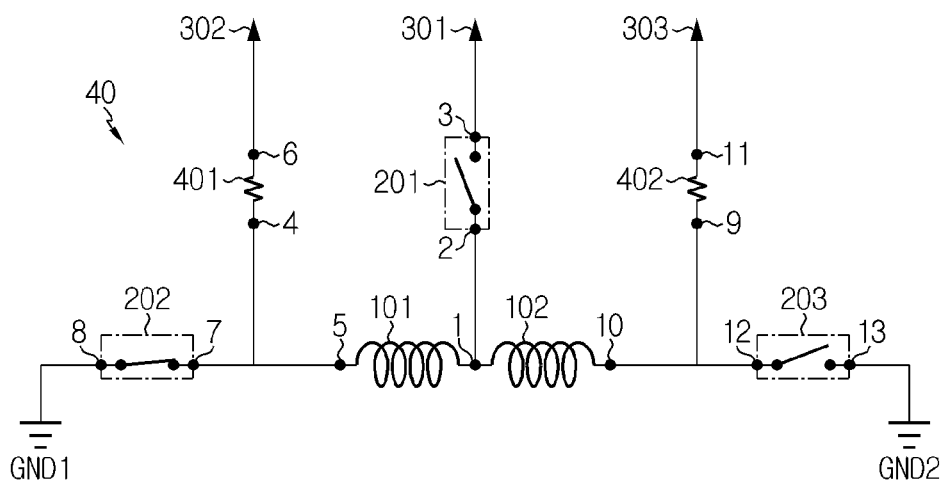

FIG. 4 is a diagram showing that the first switch 201 and the third switch 203 of the relay driving circuit 40 of FIG. 2 are turned off and the second switch 202 is turned on. Namely, FIG. 4 may be regarded as a diagram showing that the second diagnosing circuit is formed.

Referring to FIG. 4, if the first switch 201, the second switch 202 and the third switch 203 are diagnosed as having no short-circuit fault, the processor 1300 may diagnose whether the relay driving circuit 40 has an open-circuit fault.

For this, the processor 1300 may control the operation states of the first switch 201 and the third switch 203 into a turn-off state and controls the operation state of the second switch 202 into a turn-on state to form the relay driving circuit 40 as the second diagnosing circuit.

Meanwhile, the sensing unit 1100 may measure the first measured voltage, the second measured voltage and the third measured voltage in a state where the second diagnosing circuit is formed.

In addition, the processor 1300 may diagnose whether the relay driving circuit 40 has an open-circuit fault based on at least one of the first measured voltage, the second measured voltage and the third measured voltage measured in the state where the second diagnosing circuit is formed.

For example, the processor 1300 may diagnose whether the second switch 202 has an open-circuit fault by comparing the second measured voltage measured in the state where the second diagnosing circuit is formed with the ground voltage. More specifically, if the second measured voltage is not identical to the ground voltage, the processor 1300 may diagnose that the second switch 202 has an open-circuit fault.

If the first switch 201, the second switch 202 and the third switch 203 are in a normal state, the first switch 201 and the third switch 203 are controlled onto a turn-off state in the second diagnosing circuit, and the second switch 202 is controls into a turn-on state, so the second measured voltage should be identical to the ground voltage.

That is, if the second switch 202 is in a normal state, the second measured voltage measured from the second diagnosing circuit may be identical to the ground voltage.

Conversely, if the second switch 202 has an open-circuit fault, the second switch 202 is in a turn-off state in the second diagnosing circuit, so the second measured voltage should be identical to the pull-up voltage.

That is, if the second switch 202 has an open-circuit fault, the second measured voltage measured from the second diagnosing circuit may be identical to the pull-up voltage.

By using this, if the second measured voltage measured in the state where the second diagnosing circuit is formed is not identical to the ground voltage, the processor 1300 may diagnose that the second switch 202 has an open-circuit fault.

Meanwhile, according to another embodiment, the processor 1300 may diagnose whether the relay driving circuit 40 has a disconnection fault based on at least one of the third measured voltage and the first measured voltage in a state where the relay driving circuit 40 is formed as the second diagnosing circuit. Here, the disconnection fault of the relay driving circuit 40 may refer to a disconnection fault of at least one of the first relay coil 101 and the second relay coil 102. In addition, here, the disconnection fault may refer to a state in which the relay coil is partially disconnected to interrupt the electrical connection.

Hereinafter, the operation of diagnosing whether the relay driving circuit 40 has a disconnection fault will be described with reference to FIG. 5.

Figure 5:
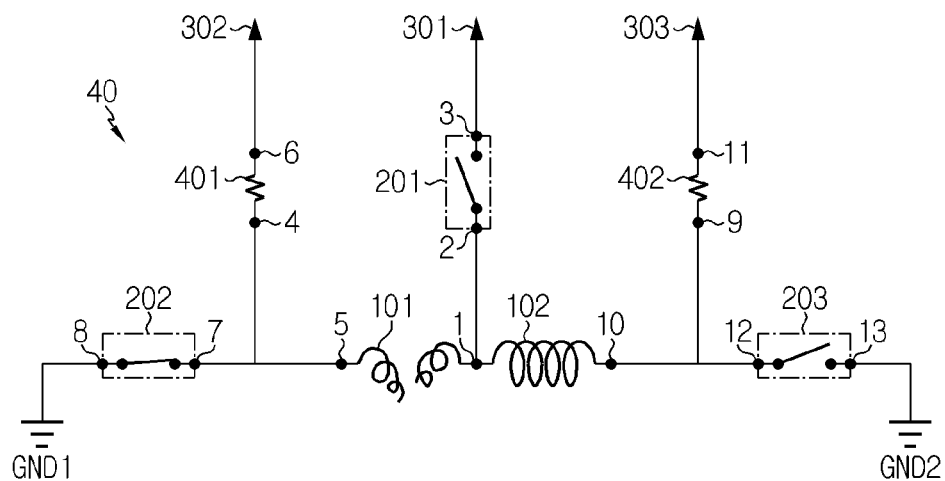
FIG. 5 is a diagram showing that the first switch and the third switch of the relay driving circuit of FIG. 2 are turned off, the second switch is turned on, and the first relay coil is disconnected.

FIG. 5 is a diagram showing that the first switch 201 and the third switch 203 of the relay driving circuit 40 of FIG. 2 are turned off, the second switch 202 is turned on, and the first relay coil 101 is disconnected. Namely, FIG. 5 may be regarded as a diagram showing that the first relay coil 101 is disconnected.

Referring to FIG. 5, if the first switch 201, the second switch 202 and the third switch 203 are diagnosed as not having a short-circuit fault and the second switch 202 is diagnosed as not having an open-circuit fault, it may be diagnosed whether the first relay coil 101 has a disconnection fault based on at least one of the third measured voltage and the first measured voltage measured in the state where the second diagnosing circuit is formed. More specifically, if the third measured voltage is not identical to the ground voltage and the first measured voltage is not identical to the ground voltage, the processor 1300 may diagnose that the first relay coil 101 has a disconnection fault.

If the first switch 201, the second switch 202 and the third switch 203 are in a normal state and the first relay coil 101 does not have a disconnection fault, the third measured voltage and the first measured voltage measured from the second diagnosing circuit should be identical to the ground voltage.

By using this, if the third measured voltage and the first measured voltage measured in the state where the second diagnosing circuit is formed are not identical to the ground voltage, the processor 1300 may diagnose that the first relay coil 101 has a disconnection fault.

Hereinafter, the operation of diagnosing whether the relay driving circuit 40 has an open-circuit fault will be described further with reference to FIG. 6.

Figure 6:
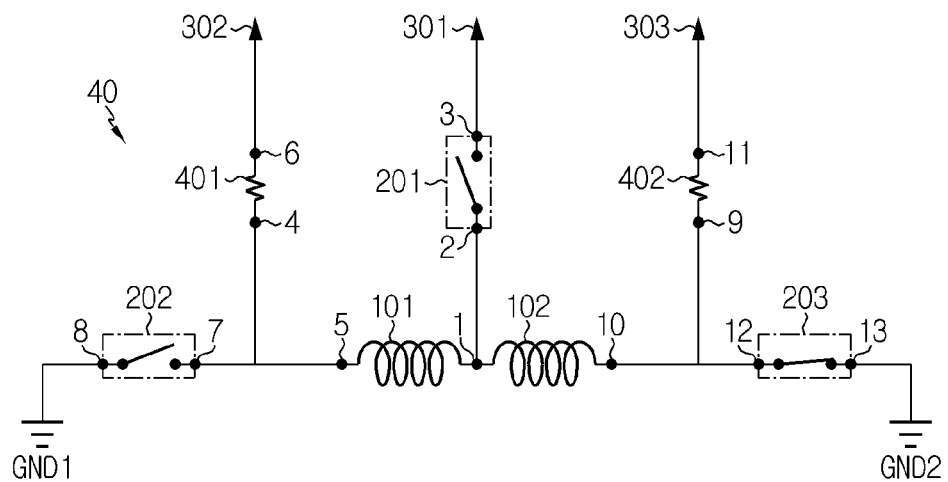

FIG. 6 is a diagram showing that the first switch 201 and the second switch 202 of the relay driving circuit 40 of FIG. 2 are turned off and the third switch 203 is turned on. Namely, FIG. 6 may be regarded as a diagram showing that the third diagnosing circuit is formed.

Referring to FIG. 6, if the first switch 201, the second switch 202 and the third switch 203 are diagnosed as not having a short-circuit fault and the second switch 202 is diagnosed as not having an open-circuit fault, the processor 1300 may diagnose whether the relay driving circuit 40 has an open-circuit fault.

For this, the processor 1300 may control the operation states of the first switch 201 and the second switch 202 into a turn-off state and control the operation state of the third switch 203 into a turn-on state to form the relay driving circuit 40 as the third diagnosing circuit.

Meanwhile, the sensing unit 1100 may measure the first measured voltage, the second measured voltage and the third measured voltage in a state where the third diagnosing circuit is formed.

In addition, the processor 1300 may diagnose whether the relay driving circuit 40 has an open-circuit fault based on at least one of the first measured voltage, the second measured voltage and the third measured voltage measured in the state where the third diagnosing circuit is formed.

For example, the processor 1300 may diagnose whether the third switch 203 has an open-circuit fault by comparing the third measured voltage measured in the state where the third diagnosing circuit is formed with the ground voltage. More specifically, the processor 1300 may diagnose that the third switch 203 has an open-circuit fault if the third measured voltage is not identical to the ground voltage.

If the first switch 201, the second switch 202 and the third switch 203 are in a normal state, since the first switch 201 and the second switch 202 are controlled into a turn-off state and the third switch 203 is controlled into a turn-on state in the third diagnosing circuit, the third measured voltage should be identical to the ground voltage. That is, if the third switch 203 is in a normal state, the third measured voltage measured from the third diagnosing circuit may be identical to the ground voltage.

Conversely, if the third switch 203 has an open-circuit fault, the third switch 203 is in a turn-off state in the third diagnosing circuit, so the third measured voltage should be identical to the pull-up voltage.

That is, if the third switch 203 has an open-circuit fault, the third measured voltage measured from the third diagnosing circuit may be identical to the pull-up voltage.

By using this, the processor 1300 may diagnose that the third switch 203 has an open-circuit fault if the third measured voltage measured in the state where the third diagnosing circuit is formed is not identical to the ground voltage.

Meanwhile, according to another embodiment, the processor 1300 may diagnose whether the relay driving circuit 40 has a disconnection fault based on at least one of the second measured voltage and the first measured voltage in a state where the relay driving circuit 40 is formed as the third diagnosing circuit.

Hereinafter, the operation of diagnosing whether the relay driving circuit 40 has a disconnection fault will be described with reference to FIGS. 7 and 8.

Figure 7:
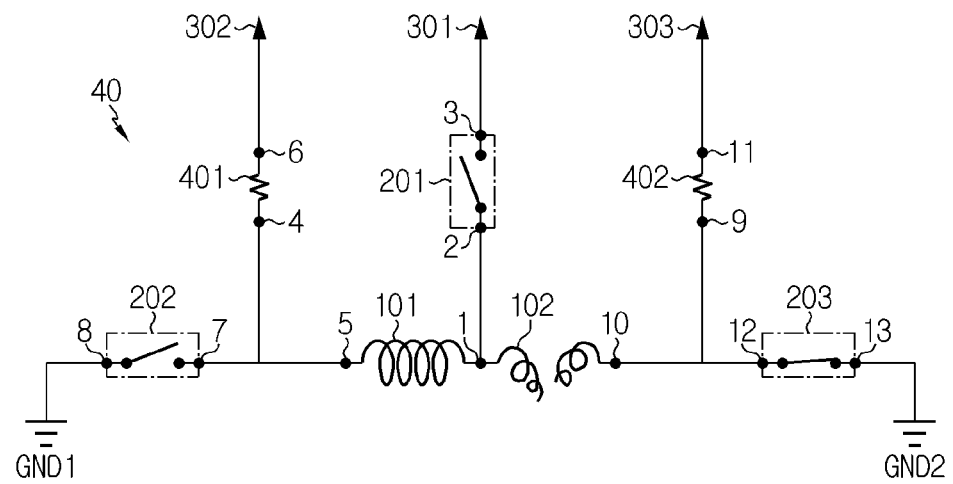
FIG. 7 is a diagram showing that the first switch and the second switch of the relay driving circuit of FIG. 2 are turned off, the third switch is turned on, and the second relay coil is disconnected.

FIG. 7 is a diagram showing that the first switch 201 and the second switch 202 of the relay driving circuit 40 of FIG. 2 are turned off, the third switch 203 is turned on, and the second relay coil 102 is disconnected. Namely, FIG. 7 may be regarded as a diagram showing that the third diagnosing circuit is formed and the second relay coil 102 is disconnected.

Figure 8:
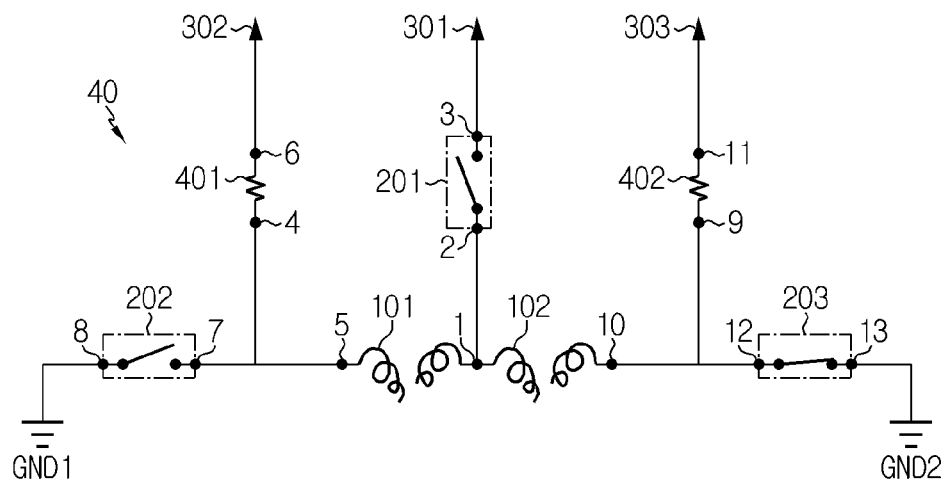
FIG. 8 is a diagram showing that that the first relay coil of the relay driving circuit of FIG. 7 is disconnected.

FIG. 8 is a diagram showing that that the first relay coil 101 of the relay driving circuit 40 of FIG. 7 is disconnected. Namely, FIG. 8 may be regarded as a diagram showing that the third diagnosing circuit is formed and the first relay coil 101 and the second relay coil 102 are disconnected.

First, referring to FIG. 7, if the first switch 201, the second switch 202 and the third switch 203 are diagnosed as not having a short-circuit fault and the first switch 201 and the second switch 202 are diagnosing as not having an open-circuit fault, the processor 1300 may diagnose whether that the second relay coil 102 has a disconnection fault based on at least one of the second measured voltage and the first measured voltage measured in the state where the third diagnosing circuit is formed. More specifically, if the second measured voltage is not identical to the ground voltage and the first measured voltage is not identical to the ground voltage, the processor 1300 may diagnose that the second relay coil 102 has a disconnection fault.

If the first switch 201, the second switch 202 and the third switch 203 are in a normal state and the second relay coil 102 does not have a disconnection fault, the second measured voltage and the first measured voltage measured from the third diagnosing circuit should be identical to the ground voltage.

By using this, the processor 1300 may diagnose that the second relay coil 102 has a disconnection fault if the second measured voltage and the first measured voltage measured in the state where the third diagnosing circuit is formed are not identical to the ground voltage.

Referring to FIG. 8, if the second measured voltage measured in the state where the third diagnosing circuit is formed is not identical to the ground voltage and the first measured voltage is not identical to the ground voltage, and the first measured voltage measured in the state where the first diagnosing circuit is formed is not identical to the pull-up voltage and the first measured voltage is not identical to the auxiliary voltage, the processor 1300 may diagnose that the first relay coil 101 as well as the second relay coil 102 has a disconnection fault.

According to this configuration of the present disclosure, it is possible to diagnose whether both two relay coils 101, 102 provided in the relay 30 have a disconnection fault, respectively.

Hereinafter, the operation of diagnosing whether the relay driving circuit 40 has an open-circuit fault will be described further with reference to FIG. 9.

Figure 9:
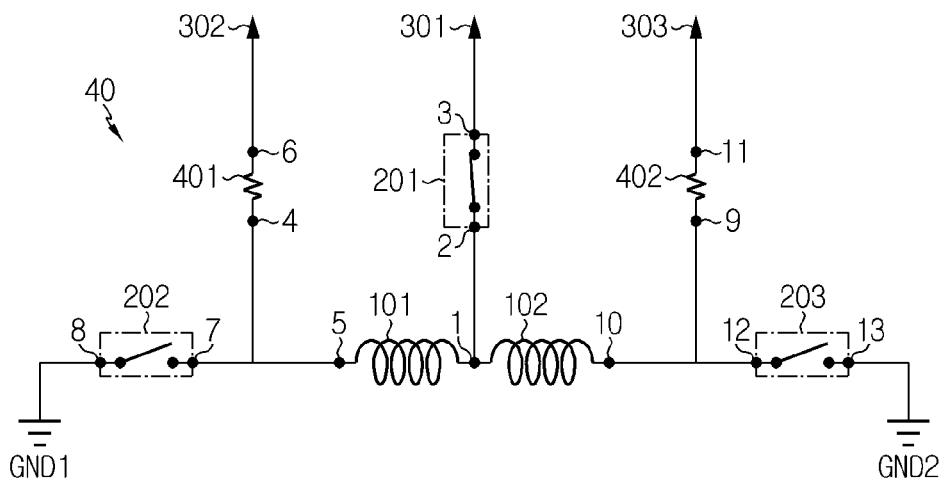
FIG. 9 is a diagram showing that the first switch of the relay driving circuit of FIG. 2 is turned on, and the second switch and the third switch are turned off.

FIG. 9 is a diagram showing that the first switch 201 of the relay driving circuit 40 of FIG. 2 is turned on, and the second switch 202 and the third switch 203 are turned off. Namely, FIG. 9 may be regarded as a diagram showing that the fourth diagnosing circuit is formed.

Referring to FIG. 9, if the first switch 201, the second switch 202 and the third switch 203 are diagnosed as not having a short-circuit fault and the second switch 202 and the third switch 203 are diagnosed as not having an open-circuit fault, the processor 1300 may diagnose whether the relay driving circuit 40 has an open-circuit fault.

For this, the processor 1300 may control the first switch 201 into a turn-on state and control the second switch 202 and the third switch 203 into a turn-off state to form the relay driving circuit 40 as the fourth diagnosing circuit.

Meanwhile, the sensing unit 1100 may measure the first measured voltage, the second measured voltage and the third measured voltage in a state where the fourth diagnosing circuit is formed.

In addition, the processor 1300 may diagnose whether the relay driving circuit 40 has an open-circuit fault based on at least one of the first measured voltage, the second measured voltage and the third measured voltage measured in the state where the fourth diagnosing circuit is formed.

For example, the processor 1300 may diagnose whether the first switch 201 has an open-circuit fault by comparing the first measured voltage measured in the state where the fourth diagnosing circuit is formed with the auxiliary voltage. More specifically, the processor 1300 may diagnose that the first switch 201 has an open-circuit fault if the first measured voltage is not identical to the auxiliary voltage.

If the first switch 201, the second switch 202 and the third switch 203 are in a normal state, the first switch 201 is controlled into a turn-on state and the second switch 202 and the third switch 203 are controlled into a turn-off state, so the first measured voltage should be identical to the auxiliary voltage.

That is, if the first switch 201 is in a normal state, the first measured voltage measured from the fourth diagnosing circuit may be identical to the auxiliary voltage.

Conversely, if the first switch 201 has an open-circuit fault, the first switch 201 is in a turn-off state in the fourth diagnosing circuit, so the first measured voltage should be identical to the pull-up voltage.

That is, if the first switch 201 has an open-circuit fault, the first measured voltage measured from the fourth diagnosing circuit may be identical to the pull-up voltage.

By using this, the processor 1300 may diagnose that the first switch 201 has an open-circuit fault if the first measured voltage measured in the state where the fourth diagnosing circuit is formed is not identical to the auxiliary voltage.

Meanwhile, the processor 1300 may selectively include an application-specific integrated circuit (ASIC), another chipset, a logic circuit, a register, a communication modem, and a data processing device. At least one of the various control logics executable by the processor 1300 may be combined, and the combined control logic is written in a computer-readable code system and recorded on a computer-readable recording medium. The recording medium has no limitation as long as it can be accessed by the processor 1300 included in a computer. As one example, the recording medium includes at least one selected from the group consisting of a ROM, a RAM, a register, a CD-ROM, a magnetic tape, a hard disk, a floppy disk and an optical data recording device. In addition, the code system may be modulated into a carrier signal and stored in a communication carrier at a specific time, and may be stored and executed in a distributed manner on computers connected through a network. Moreover, functional programs, code and segments for implementing the combined control logics may be easily inferred by programmers in the technical field to which the present disclosure belongs.

Meanwhile, the notification unit 1400 may receive the diagnosis result of the processor 1300 from the processor 1300 or output the diagnosis result of the processor 1300 stored in the memory unit 1200 to the outside.

More specifically, the notification unit 1400 may include at least one of a display unit for displaying the diagnosis result of the processor 1300 by using at least one of symbols, numbers and codes, and a speaker unit for outputting the diagnosis result of the processor 1300 with a sound.

Hereinafter, an apparatus 1000' for diagnosing a relay driving circuit according to another embodiment of the present disclosure will be described.

Figure 10:
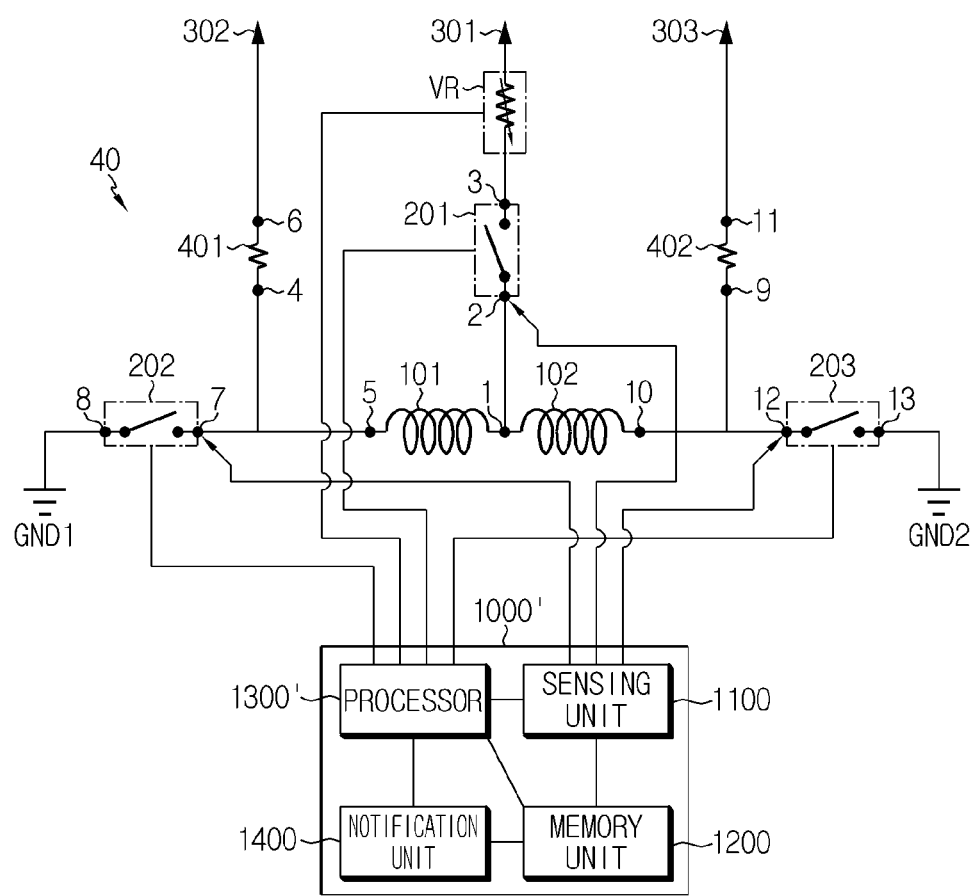
FIG. 10 is a diagram schematically showing a connection configuration between the relay driving circuit according to an embodiment of the present disclosure and an apparatus for diagnosing a relay driving circuit according to another embodiment of the present disclosure.

FIG. 10 is a diagram schematically showing a connection configuration between the relay driving circuit 40 according to an embodiment of the present disclosure and an apparatus 1000' for diagnosing a relay driving circuit according to another embodiment of the present disclosure.

Referring to FIG. 10 further, the apparatus 1000' for diagnosing a relay driving circuit according to another embodiment of the present disclosure may be identical to the apparatus 1000 for diagnosing a relay driving circuit according to an embodiment of the present disclosure, except that a variable resistor $V_R$ is further provided between the first power source 301 and the first switch 201. Thus, the repeated explanations will be omitted.

The variable resistor $V_R$ may be a resistance element whose resistance is changed under the control of the processor 1300'. The type of the variable resistor $V_R$ is not limited as long as the resistance changes corresponding to the control signal of the processor 1300'.

The processor 1300' according to another embodiment may control the variable resistor $V_R$ to change the resistance of the variable resistor $V_R$ into a minimum resistance before the first switch 201 is diagnosed as having a short-circuit fault.

If the first measured voltage measured in the state where the first diagnosing circuit is formed is not identical to the pull-up voltage and the first measured voltage is identical to the auxiliary voltage, the processor 1300' may diagnose that the first switch 201 has a short-circuit fault.

After that, if the first switch 201 is diagnosed as having a short-circuit fault, the processor 1300' may control the variable resistor $V_R$ so that the resistance of the variable resistor $V_R$ increases.

By doing so, if a non-load circuit is formed between the first power source 301 and at least one of the first ground GND1 and second ground GND2 as a short-circuit fault occurs at the first switch 201 connected to the first power source 301, it is possible to prevent the first power source 301 from being discharged.

Meanwhile, according to another embodiment of the present disclosure, the apparatus 1000 for diagnosing a relay driving circuit may be applied to a battery management system that manages a battery of a battery pack, an energy storage device or the like. Namely, the battery management system according to the present disclosure may include the apparatus for diagnosing a relay driving circuit according to the present disclosure.

In addition, according to another embodiment of the present disclosure, the apparatus 1000 for diagnosing a relay driving circuit may be included in a battery pack. Namely, the battery pack according to another embodiment of the present disclosure may include the apparatus 1000 for diagnosing a relay driving circuit as described above.

Moreover, according to still another embodiment of the present disclosure, the apparatus 1000 for diagnosing a relay driving circuit may be included in an electric vehicle. Namely, the electric vehicle according to still another embodiment of the present disclosure may include the apparatus 1000 for diagnosing a relay driving circuit as described above. Here, the electric vehicle is a vehicle using an electric energy as a power source and includes an electric vehicle and a hybrid electric vehicle.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, the term ' . . . unit' has been used in this specification, but this represents a logical unit component, and as obvious to those skilled in the art, it does not mean that unit components can be physically separated or must be physically separated from each other, and it also does not mean that each unit component can be necessarily implemented by one physical element or device.

The features described in the individual embodiments of this specification may be implemented in combination in a single embodiment. Conversely, various features described in a single embodiment may be implemented in various embodiments individually or in a suitable sub-combination.

What is claimed is:

1. An apparatus for diagnosing a fault of a relay driving circuit that includes a first relay coil and a second relay coil, wherein a first end of the first relay coil is connected to a first end of the second relay coil, a first switch having a first end connected to the first end of the first relay coil and the first end of the second relay coil, a first power source configured to apply an auxiliary voltage to a second end of the first switch, a first pull-up resistor having a first end connected to a second end of the first relay coil, a second power source configured to apply a pull-up voltage to a second end of the first pull-up resistor, a second switch having a first end connected to a second end of the first relay coil and the first end of the first pull-up resistor, a second pull-up resistor having a first end connected to a second end of the second relay coil, a third power source configured to apply the pull-up voltage to the second end of the second pull-up resistor, and a third switch having a first end connected to the second end of the second relay coil and the first end of the second pull-up resistor, wherein the apparatus is configured to measure a first measured voltage, a second measured voltage and a third measured voltage respectively applied to the first end of the first switch, the first end of the second switch and the first end of the third switch, wherein the apparatus comprises a processor configured to:

control operation states of the first switch, the second switch and the third switch; and in an operation state that forms a diagnosing circuit, diagnose whether the relay driving circuit has a fault based on at least one of the first measured voltage, the second measured voltage and the third measured voltage measured by the apparatus.

2. The apparatus for diagnosing a relay driving circuit according to claim 1, wherein the processor is configured to:

control the operation states of the first switch, the second switch and the third switch into a turn-off state, respectively, to form a first diagnosing circuit; and when the first diagnosing circuit is formed, diagnose whether the relay driving circuit has a short-circuit fault based on at least one of the first measured voltage, the second measured voltage and the third measured voltage.

3. The apparatus for diagnosing a relay driving circuit according to claim 2, wherein the processor is configured to:

diagnose whether the first switch has a short-circuit fault by comparing the first measured voltage with at least one of the pull-up voltage and the auxiliary voltage;

diagnose whether the second switch has a short-circuit fault by comparing the second measured voltage with a ground voltage; and diagnose whether the third switch has a short-circuit fault by comparing the third measured voltage with the ground voltage.

4. The apparatus for diagnosing a relay driving circuit according to claim 3, wherein the processor is configured to:

determine that the first switch has a short-circuit fault when the first measured voltage is not identical to the pull-up voltage and the first measured voltage is identical to the auxiliary voltage;

determine that the second switch has a short-circuit fault when the second measured voltage is identical to the ground voltage; and determine that the third switch has a short-circuit fault when the third measured voltage is identical to the ground voltage.

5. The apparatus for diagnosing a relay driving circuit according to claim 1, wherein the processor is configured to:

control the operation states of the first switch and the third switch into a turn-off state, respectively, and the operation state of the second switch into a turn-on state to form a second diagnosing circuit; and when the second diagnosing circuit is formed, diagnose whether the relay driving circuit has an open-circuit fault based on at least one of the first measured voltage, the second measured voltage and the third measured voltage.

6. The apparatus for diagnosing a relay driving circuit according to claim 5,
wherein the processor is configured to diagnose whether the second switch has an open-circuit fault by comparing the second measured voltage with a ground voltage.

7. The apparatus for diagnosing a relay driving circuit according to claim 6,
wherein the processor is configured to determine that the second switch has an open-circuit fault when the second measured voltage is not identical to the ground voltage.

8. The apparatus for diagnosing a relay driving circuit according to claim 1,
wherein the processor is configured to:
control the operation states of the first switch and the second switch into a turn-off state, respectively, and the operation state of the third switch into a turn-on state to form a third diagnosing circuit; and
when the third diagnosing circuit is formed, diagnose whether the relay driving circuit has an open-circuit fault based on at least one of the first measured voltage, the second measured voltage and the third measured voltage.

9. The apparatus for diagnosing a relay driving circuit according to claim 8,
wherein the processor is configured to diagnose whether the third switch has an open-circuit fault by comparing the third measured voltage with a ground voltage.

10. The apparatus for diagnosing a relay driving circuit according to claim 9,
wherein the processor is configured to determine that the third switch has an open-circuit fault when the third measured voltage is not identical to a ground voltage.

11. The apparatus for diagnosing a relay driving circuit according to claim 1,
wherein the processor is configured to:
control the operation states of the second switch and the third switch into a turn-off state, respectively, and the operation state of the first switch into a turn-on state to form a fourth diagnosing circuit; and
when the fourth diagnosing circuit is formed, diagnose whether the relay driving circuit has an open-circuit fault based on at least one of the first measured voltage, the second measured voltage and the third measured voltage.

12. The apparatus for diagnosing a relay driving circuit according to claim 11,
wherein the processor is configured to diagnose whether the first switch has an open-circuit fault by comparing the first measured voltage with the auxiliary voltage.

13. The apparatus for diagnosing a relay driving circuit according to claim 12,
wherein the processor is configured to determine that the first switch has an open-circuit fault when the first measured voltage is not identical to the auxiliary voltage.

14. A battery management system, comprising the apparatus for diagnosing a relay driving circuit according to claim 1.

15. A battery pack, comprising the apparatus for diagnosing a relay driving circuit according to claim 1.

\* \* \* \* \*